(12) United States Patent
Pischl et al.

(10) Patent No.: US 6,177,804 B1
(45) Date of Patent: Jan. 23, 2001

(54) COMMON-MODE VOLTAGE PROBE FOR PREDICTING EMI FROM UNSHIELDED DIFFERENTIAL-PAIR CABLES

(75) Inventors: Neven Pischl, Santa Clara; John Lockwood, Dublin, both of CA (US)

(73) Assignee: Nortel Networks Limited, Montreal (CA)

( * ) Notice: Under 35 U.S.C. 154(b), the term of this patent shall be extended for 0 days.

(21) Appl. No.: 09/205,025

(22) Filed: Dec. 3, 1998

(51) Int. Cl.[7] ................................................. G01R 27/28
(52) U.S. Cl. .............................................. 324/627; 324/72
(58) Field of Search ................................... 324/754, 620, 324/625, 613, 627, 628, 72.5

(56) References Cited

U.S. PATENT DOCUMENTS

| | | | |
|---|---|---|---|
| Re. 35,644 | * 10/1997 | Rogers | 324/72 |
| 5,130,640 | * 7/1992 | Gambill et al. | 324/73.1 |
| 5,345,182 | * 9/1994 | Wakamatsu | 324/649 |
| 5,495,173 | * 2/1996 | Bockelman et al. | 324/625 |
| 5,552,715 | * 9/1996 | Rogers | 324/627 |
| 5,701,082 | * 12/1997 | Rogers | 324/628 |
| 5,723,975 | * 3/1998 | Rogers | 324/72.5 |
| 5,949,230 | * 9/1999 | Kobayashi et al. | 324/72.5 |

* cited by examiner

*Primary Examiner*—Safet Metjahic
*Assistant Examiner*—Vincent Q. Nguyen
(74) *Attorney, Agent, or Firm*—Blakely Sokoloff Taylor & Zafman LLP

(57) ABSTRACT

According to one embodiment of the present invention, a voltage probe for measuring common-mode (CM) voltage of a device under test (DUT) having differential input/output (I/O) signals is disclosed. The probe includes a connector adapted to couple to the DUT, at least one output measurement port configured to connect to a measuring device for measuring the CM voltage, and at least one differential pair cable connected to a connector and to a at least one measurement port for coupling a differential I/O signals to a measurement port. According to a second embodiment, the present invention provides a voltage probe for measuring CM voltage of a DUT having differential I/O signals while the DUT is simultaneously connected to an auxiliary equipment. According to a third embodiment, the present invention provides a method for measuring EMI from a DUT. A CM voltage probe is interposed between the DUT and an EMI measurement device. The CM voltage is measured at an measurement port of the voltage probe. The measured CM voltage is compared to a limit for EMI.

17 Claims, 5 Drawing Sheets

CM VOLTAGE PROBE

COMMON-MODE VOLTAGE PROBE FOR PREDICTING EMI FROM UNSHIELDED DIFFERENTIAL-PAIR CABLES

BACKGROUND OF THE INVENTION

1. Field of the Invention

The present invention generally relates to devices for measuring the electromagnetic interference (EMI) from electrical and electronic devices. More specifically, the present invention relates to a device for predicting the EMI radiated from interconnect cables of electrical and electronic devices.

2. Description of the Related Art

Electrical and electronic devices typically generate electromagnetic emission sometimes called EMI. Significant contributors to the overall EMI of a particular device are caused by common-mode (CM) currents on the interconnect cables and cables within the device. CM currents at the input/output (I/O) cables are the result of CM voltage at the connectors of the device. Normally, in the functional design of a device only the differential mode currents are considered and these currents constitute the normal or functional signals generated by the device. However, CM current may sometimes be superimposed on the differential mode currents, thereby causing EMI. The EMI generated by these devices propagate as conducted or radiate missions and may degrade the performance of the nearby electronic devices. Various national and international standards such as FCC part 15 and EN55022 regulate the conducted and radiated emission to permissible levels.

Several conventional techniques exist for measurement of EMI and troubleshooting EMI problems. One such method is the radiated-emission measurement technique. A device under test (DUT) is placed in an open area test site (OATS) on a turntable and the EMI is measured with an antenna placed usually at 10 meters from the device. FIG. 1 illustrates a CM model of a DUT with I/O cables showing the radiated-field measurement technique for determining the radiation characteristics of the DUT. A CM current $I_{CM}$ flows on an I/O cable causing radiation. The amplitude of the $I_{CM}$ depends on the CM voltage, the output impedance, and the impedance of the I/O cable. By rotating the DUT on the turntable, adjusting the height of the antenna, and finding the worst case I/O cable arrangement, the maximum radiation which varies in frequency can be found. The maximum measured field strength is therefore dependent on the position of the turntable, the antenna, and the cables. This procedure, however, is time consuming and typically takes a couple of hours to a day of testing.

In the case of shielded devices or small electrical devices with long interconnect cables attached, current clamps or a version called "absorption clamp", which directly measures the CM current on the cables are sometimes used for determining the EMI. By finding the amplitude of the CM current, the EMI may be determined. The current clamp method reduces time and provides a simpler "bench method." One disadvantage in using such a method, however, is that it is necessary to "maximize" readings by moving the clamp over at least 5–6 meters of the cable, and record the maximum at each frequency. Additionally, sometimes it is not feasible or practicable to measure a device with more than a couple of cables due to sizes of the cables involved with the current clamp. Further still, the ambient electromagnetic fields from nearby devices may also be present on the cables and the CM currents produced by such devices may also be measured with the current clamp, masking the CM noise under investigation.

Therefore, it is desirable to provide a device for measuring EMI generated from electrical and electronic devices that avoids the relatively complicated and time consuming procedures associated with the conventional methods of measuring EMI.

SUMMARY OF THE INVENTION

According to one embodiment, the present invention provides a voltage probe for measuring CM voltage of a DUT having differential input/output (I/O) signals. The probe includes a connector adapted to couple to the DUT, at least one output measurement port configured to connect to a measuring device for measuring the CM voltage, and at least one differential pair cable connected to said connector and to said at least one measurement port for coupling said differential I/O signals to said measurement port.

According to a second embodiment, the present invention provides a voltage probe for measuring CM voltage of a DUT having differential I/O signals while the DUT is simultaneously connected to an auxiliary equipment.

According to a third embodiment, the present invention provides a method for measuring EMI from a DUT. A CM voltage probe is interposed between the DUT and an EMI measurement device. The CM voltage is measured at an measurement port of the voltage probe. The measured CM voltage is compared to a limit for EMI.

BRIEF DESCRIPTION OF THE DRAWINGS

The features, aspects, and advantages of the present invention will become more fully apparent from the following detailed description, appended claims, and accompanying drawings in which:

DETAILED DESCRIPTION OF THE INVENTION

In the following description, numerous specific details are set forth to provide a thorough understanding of the present invention. However, one having an ordinary skill in the art will recognize that the invention can be practiced without these specific details. In some instances, well-known circuits, structures and techniques have not been shown in detail to avoid unnecessarily obscuring the present invention.

The present invention provides for a fast and reliable bench test method for predicting and troubleshooting EMI. The present invention is a CM voltage probe which is used to predict EMI radiated from unshielded differential-pair cables by measuring the CM voltage of a DUT.

Since CM currents are significant contributors to the radiated EMI of a device and are the result of CM voltage at the connectors of the device, by measuring the CM voltage, the probe may be used for predicting and troubleshooting radiated EMI. In the present invention, testing of a device for EMI is simplified by predicting the emission levels that would otherwise be obtained from a DUT at an OATS. From the predicted EMI values, the invention allows for a fast and convenient way of determining whether the DUT is likely to fail or to fulfill the EMI requirement.

The present invention is also useful as a tool for troubleshooting EMI in case of a device exceeding the regulatory limits of EMI and may also be used to characterize/qualify different components of the device. The component that has to be qualified can be compared either against a known, qualified device, or against some known limit. If a DUT yields too high an emission at some frequency, the problem may be remedied in the lab without having to go outside to an OATS. Thus, modifications to the device may be made in the lab and the effect of those modifications may be confirmed in the lab by using an EMI meter such as a spectrum analyzer. The effects of the modifications can be evaluated by comparing the CM voltage prior to and after any modifications. So if the modification reduces the devices CM voltage, hence the CM current, at the problem frequency then there is a reasonable good probability that the radiated EMI will be similarly reduced at that frequency at the OATS. Thus, the invention can be instrumental in reducing the time and cost of troubleshooting EMI problems.

Figure 1:
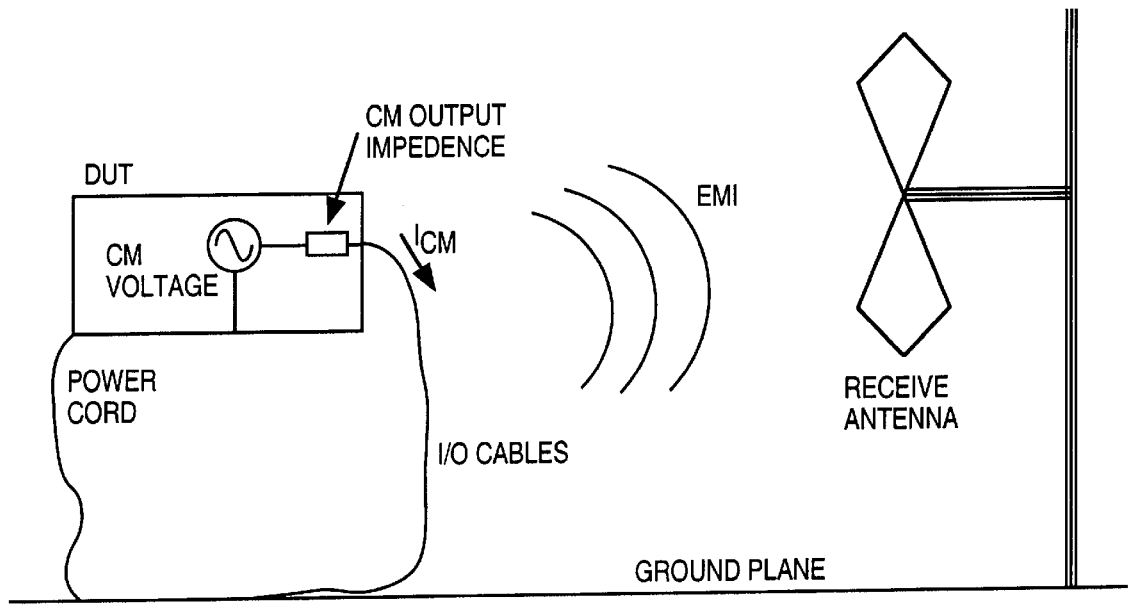
FIG. 1 shows a CM model of a DUT with I/O cables showing the radiated emission measurement technique for determining the radiation characteristics of the DUT.
Figure 2:
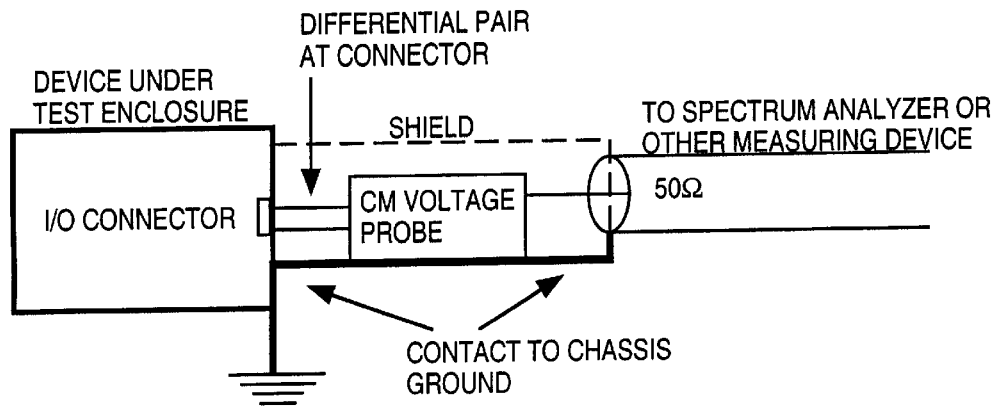
FIG. 2 shows a schematic of a DUT using the CM voltage probe according to one embodiment of the present invention.

FIG. 2 shows a schematic of a DUT using the CM voltage probe according to one embodiment of the present invention. The CM voltage probe is used to measure the CM voltage on the I/O connector of the DUT. The DUT may be any electrical or electronic devices that uses unshielded differential pair I/O cables, typically used in networking or telecommunication equipments. The DUT may include, for example, local area networks (LANs). LANs are widely used and among the most popular LANs is Ethernet which often uses unshielded twisted pair (UTP) cables having 100Ω characteristic impedance.

The CM voltage probe of the present invention is connected into an I/O connector of a DUT. The I/O connector may be an RJ45 connector of a LAN equipment, for instance, or any other type of I/O connector having differential output signals from which the CM voltage probe may be plugged into. By plugging the CM voltage probe into the I/O connector, the probe makes contact to the chassis ground at the I/O connector of the device being measured, providing a reference for the CM voltage measurement. Since the CM current on the cables is caused by CM voltage at the I/O connector of the device, the CM voltage on the I/O connector is related to the EMI from the device. By measuring the CM voltage with the probe of the present invention, reasonably accurate predictions of the radiated EMI from a DUT may be obtained.

The CM voltage probe further includes output measurement port(s) adapted to be connected to a measuring device, such as a spectrum analyzer for measurement of the CM voltage on I/O differential pairs in the connector. The CM voltage probe provides impedance matching between the CM output impedance of the differential pairs and the CM input impedance of the measuring device (usually 50Ω). In one embodiment of the present invention, the CM voltage probe provides impedance matching to a 50 ohm measurement device, such as a spectrum analyzer. The probe also provides for cancellation of the differential signals in differential pairs.

The CM probe may or may not be shielded. In one embodiment of the present invention, the CM probe is shielded to eliminate noise coupling through the ambient electromagnetic field.

Figure 3:
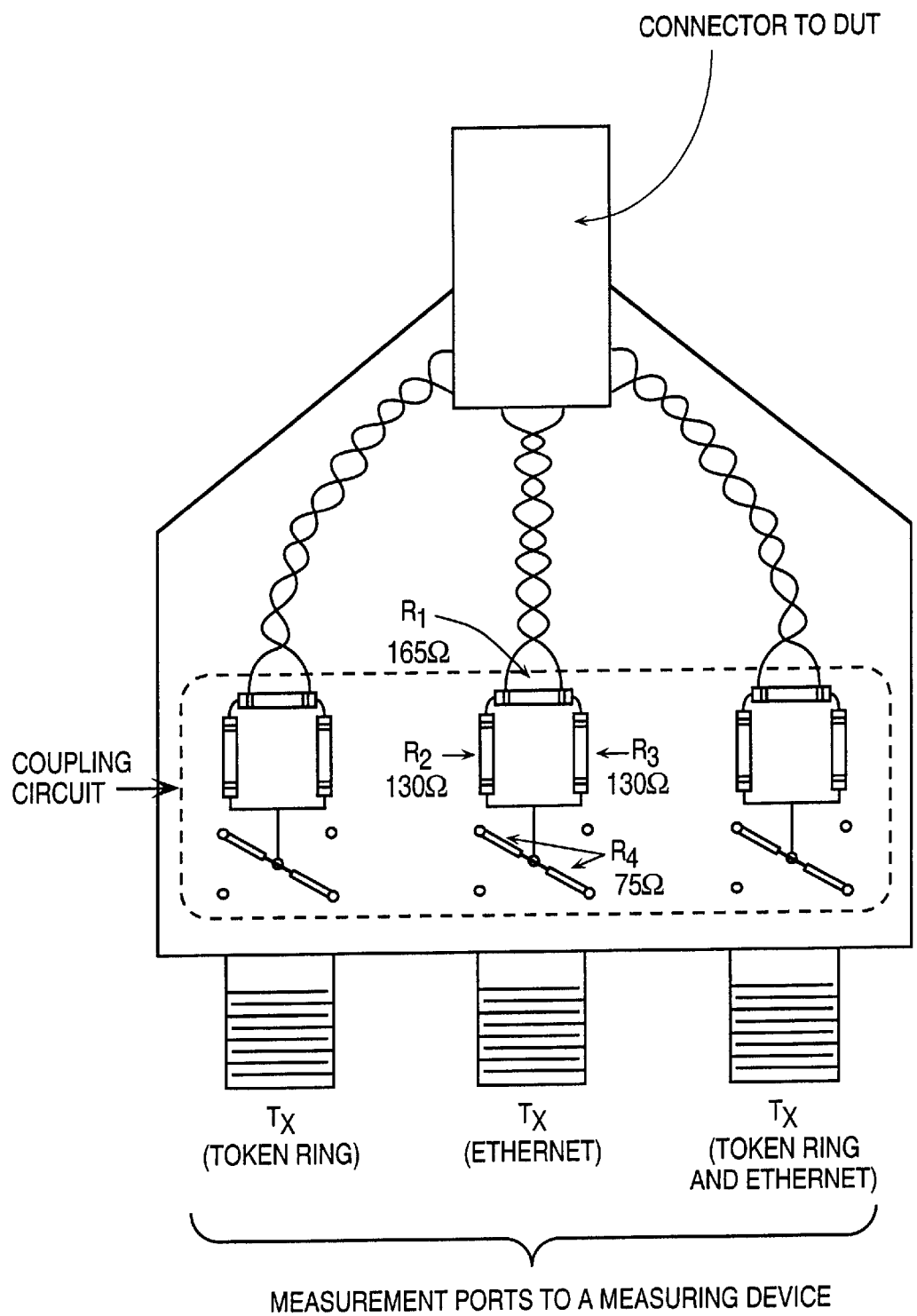
FIG. 3 shows a top view of the CM voltage probe according to one embodiment of the present invention.

FIG. 3 shows a top view of the CM voltage probe according to one embodiment of the present invention. An optional shield which prevents direct coupling of EMI fields to its conductors is not shown. As mentioned above, the CM voltage probe consists of a connector adapted to couple to a DUT having differential I/O signals. The connector may be plugged into any type of connector having differential I/O signals such as an RJ45 connector of a LAN equipment. The probe also includes at least one measurement port configured to connect to a measuring device, such as a spectrum analyzer, for measuring the CM voltage on the differential pairs. In one embodiment of the present invention, the probe consists of three measurement ports, one for measuring Tx (on Token Ring devices), a second for measuring Tx (on Ethernet devices), and a third for measuring Rx (on Token Ring and Ethernet devices). In one embodiment of the present invention, the measurement ports are SMA connectors. Depending on the number of measurement ports, the probe also includes an equal number of differential pair cables configured to couple between the connector and a coupling circuit, the coupling circuit for matching the impedance of the probe to a measurement device. In one embodiment, the probe has three sets of differential pair cables.

Figure 4:
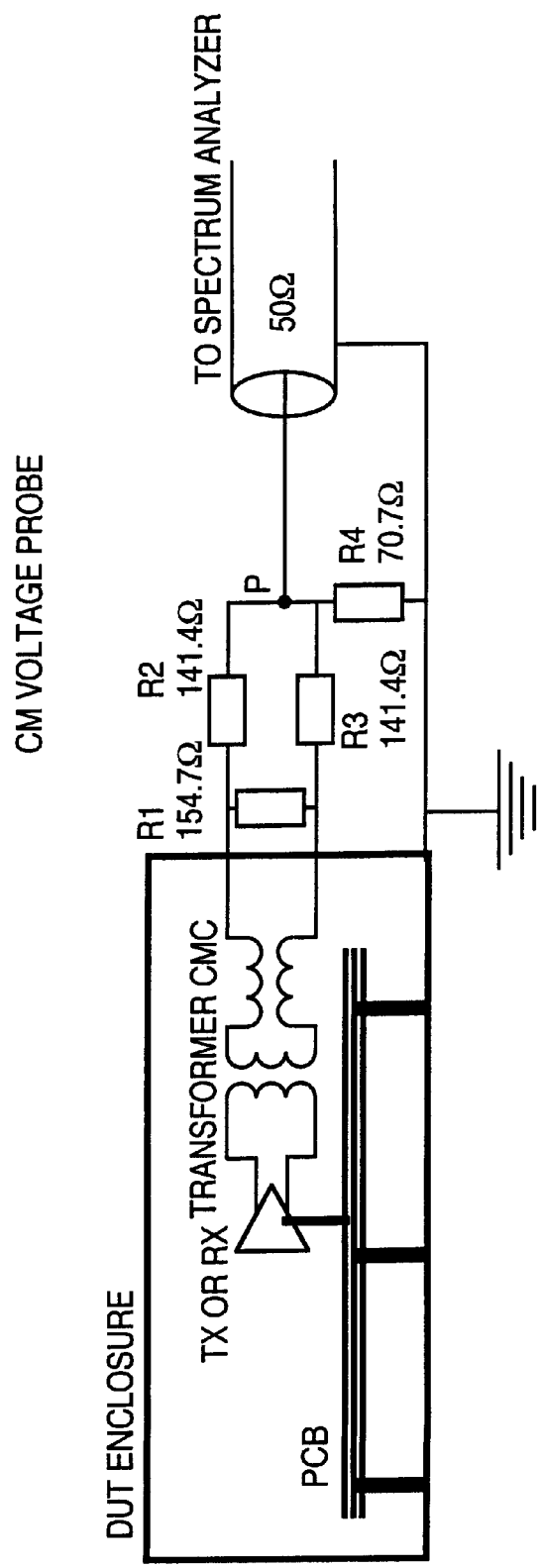
FIG. 4 shows a detailed schematic of the CM voltage probe connected to a DUT according to one embodiment of the present invention.

FIG. 4 shows a detailed schematic of the CM voltage probe connected to a DUT according to one embodiment of the present invention. Shown in FIG. 4 is a typical DUT, such as an Ethernet LAN device. In this embodiment, the DUT has a transceiver connected to the I/O connector (not shown). FIG. 4 shows that the transceiver is mounted on a printed circuit board. Unshielded twisted pair I/O cables consist of a Tx pair, an Rx pair, and two unused twisted pairs. The Tx and Rx pairs carry the differential signals.

The Tx or Rx pairs in the cable are connected to the Tx or Rx differential pairs of the transceiver. Between the transceiver and the I/O connectors there is a transformer and a CM choke (CMC). The transformer functions for safety reasons by providing dc block between the connector and the circuit inside the device. The CMC functions to provide a high attenuation of the CM signal and a low attenuation of the differential mode signal, thereby reducing EMI. The CMC has an impedance from around 100Ω (typically) to 1 KΩ.

Because the differential impedance of each pair is typically 100Ω (in Ethernet or LAN applications) the probe must present a 100Ω load to the differential pairs. In one embodiment of the present invention, FIG. 4 shows that the probe has the following coupling circuit configuration. Resistors R1, R2, and R3 provide 100Ω differential termination. Since the transceiver typically needs to be connected to 100Ω differential impedance, typical for Ethernet devices, the impedance/resistors are configured such that when R1 is connected in parallel with R2 and R3 connected in series, the transceiver will see 100Ω impedance. In one embodiment of the present invention, R1, R2, R3, and R4 have values of 154.7, 141.4, 141.4, and 70.7 ohms, respectively. Referring back again to FIG. 3, in one embodiment of the present invention, the coupling circuit has the following resistor values: R1=165Ω, R2 and R3=130±0.1% and R4=75Ω (150Ω resistor in parallel with 150Ω resistor).

In FIG. 4, at point P, the differential signals Tx+ and Tx− or Rx+ and Rx− will cancel and only CM voltage will be measured at point P relative to the chassis ground. Resistors R2 and R3 are well matched resistors that cancel the differential signals and provide a point, point P, for CM voltage measurements. R2 and R3 have to be well-matched in order to minimize conversion of differential signal to CM signal. R1 is necessary to lower the impedance of R2 and R3, otherwise, R2 and R3 would be in series and the sum would be 282.2Ω instead of the required 100Ω across transceiver's Tx or Rx differential pair. Resistor R4 has a value of 70.7Ω so that the parallel combination of R1 and R2 together with R4 in parallel to 50Ω (measuring device) provides 100Ω to 50Ω impedance matching for CM with 7.7 dB attenuation.

At each of the differential pairs, CM signal will be superimposed upon them. Ideally, all the signals in a differential line should carry differential-mode currents, not CM currents, since the CM current radiates from cables causing interference. The CM current is shown through the ground path. In the circuit configuration of an embodiment of the present invention, the CM signal does not see R1 and so the CM signal only sees R2 in parallel with R3. Thus, there is proper impedance matching such that when seen from the transceiver, the transceiver sees 100Ω impedance for CM, and when seen from the spectrum analyzer, there is 50Ω impedance which is the same as the impedance of a measurement device such as a spectrum analyzer.

The circuit configuration in this embodiment of the present invention provides a minimum loss attenuation for CM signals of 7.7 dB from the connector to the measurement ports of the probe. The attenuation helps to provide a good impedance match even if the real case impedances vary from the calculated values. Of course, other circuit configurations or various modifications to the above circuit configuration such as the use of different resistor values or the use of transformers may also be implemented to accomplish the aims of the present invention.

Figure 5:
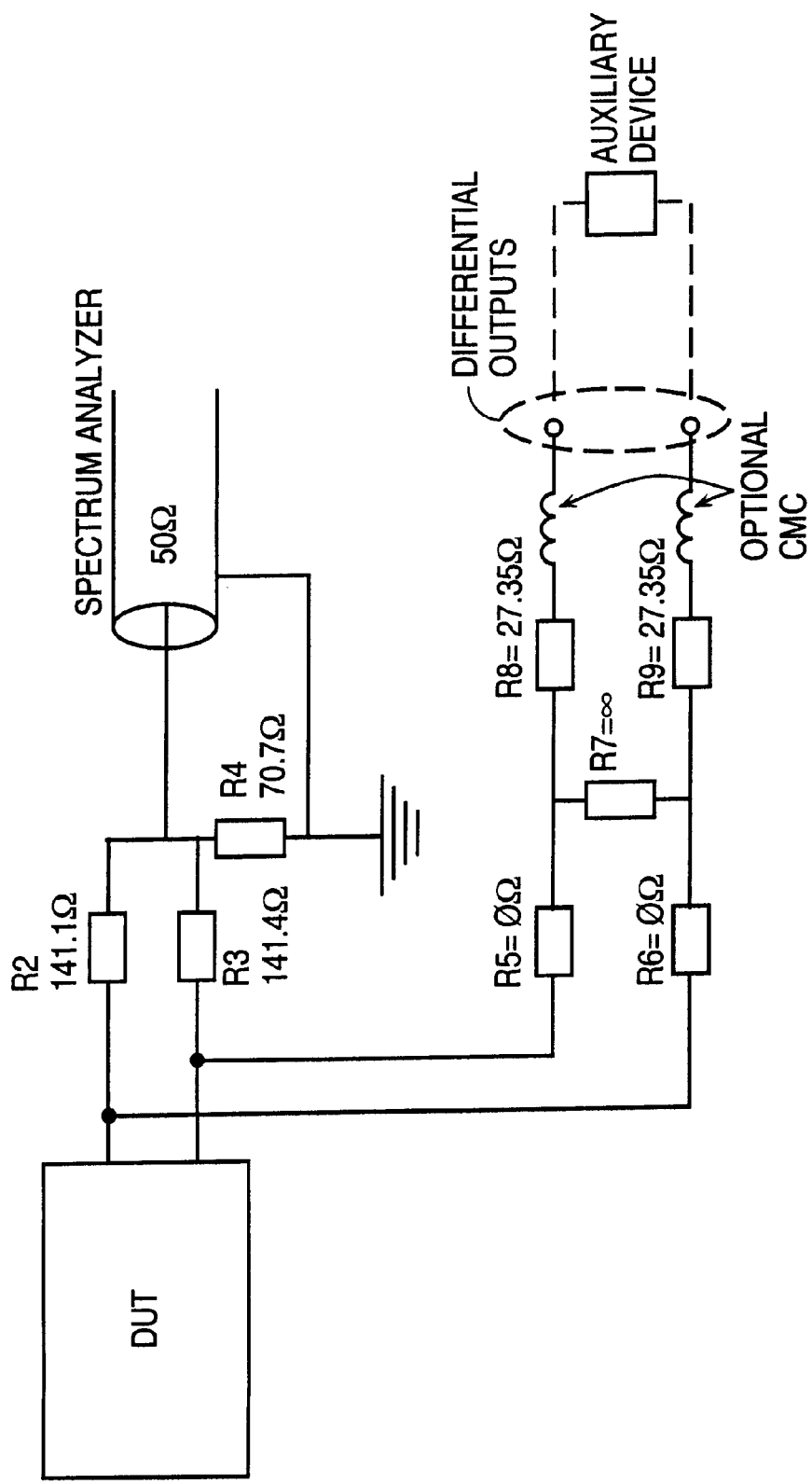
FIG. 5 shows a detailed schematic of the CM voltage probe according to a second embodiment of the present invention; and, FIG. 6 shows a graph of empirically obtained limits for average CM voltage vs. frequency on differential pairs of eight 24 port Ethernet DUTs, which corresponds to the EN55022 class A radiated emission limit (OATS).

FIG. 5 shows a detailed schematic of the CM voltage probe according to a second embodiment of the present invention. According to this second embodiment, the CM voltage probe permits the measurement of the CM voltage of a DUT while the DUT is simultaneously connected to some auxiliary equipment allowing differential signals to be sent to and received from the auxiliary equipment. The probe may include an appropriate connector to connect differential signals to this auxiliary equipment.

According to this embodiment, the resistor R1 from FIG. 4 may be replaced by a resistive network such as the one shown in FIG. 5, connected to the probe's connector. In the embodiment of the invention, the resistive network is designed such that the input impedance of the network, when connected to the auxiliary equipment, yields the same value as R1 from FIG. 4. Furthermore, the network is designed to be symmetrical in order to minimize conversion of differential mode to CM signals. FIG. 5 shows the circuit configuration of the resistive network. The resistive network includes a fifth resistive impedance (R5), a sixth resistive impedance (R6), a seventh resistive impedance (R7), an eighth resistive impedance (R8), and a ninth resistive impedance (R9). The first leg of the resistive network is connected to one terminal of a differential pair cable and includes R5 and R8 connected in series. The second leg is connected to the other terminal of the differential pair cable and includes R6 and R9 connected in series. R7 is shunted at one end between R5 and R8 and at the other end between R6 and R9. In a configuration that yields minimum loss of the differential signal between a DUT and an auxiliary equipment, the resistive network has the following resistor values: R5=R6=0Ω, R7=∞, and R8=R9=27.35Ω.

FIG. 5 only shows a network comprising of resistors. It is to be understood by those skilled in the electrical art that a circuit having capacitors and/or inductors may also be used to achieve the objective above. Furthermore, in order to reduce the CM noise from the auxiliary equipment interfering with the measurement, an optional CM choke may be added at the differential output(s) to the auxiliary equipment.

In tests, the probe revealed that the correlation between the CM voltage and the radiated emission in a case of a single differential pair is excellent, within a couple of dB. In the case of a typical 24 port devices, or 48 differential pairs (one Tx and one Rx in each of 24 ports), test results show a typical correlation better than ±7 dB.

In tests conducted on DUTs, such as typical 24-port devices, measurement of the CM voltage revealed a large difference in CM voltage levels at different ports and at certain frequencies. The tests show these differences across all 48 CM sources and some of these difference may be as large as more than 10 dB. This variation may be attributed to the layout and grounding on the circuit board. One challenge in predicting EMI is how to handle the varieties of CM voltage levels. Each CM current contributes to the total EM field. Therefore, the results show the average of the CM voltages (sum of CM voltages divided by 48), which is the equivalent of adding the CM currents on the unshielded twisted pair I/O cables. The worst case condition for radiated emission was assumed by neglecting phase differences between the ports.

Figure 6:
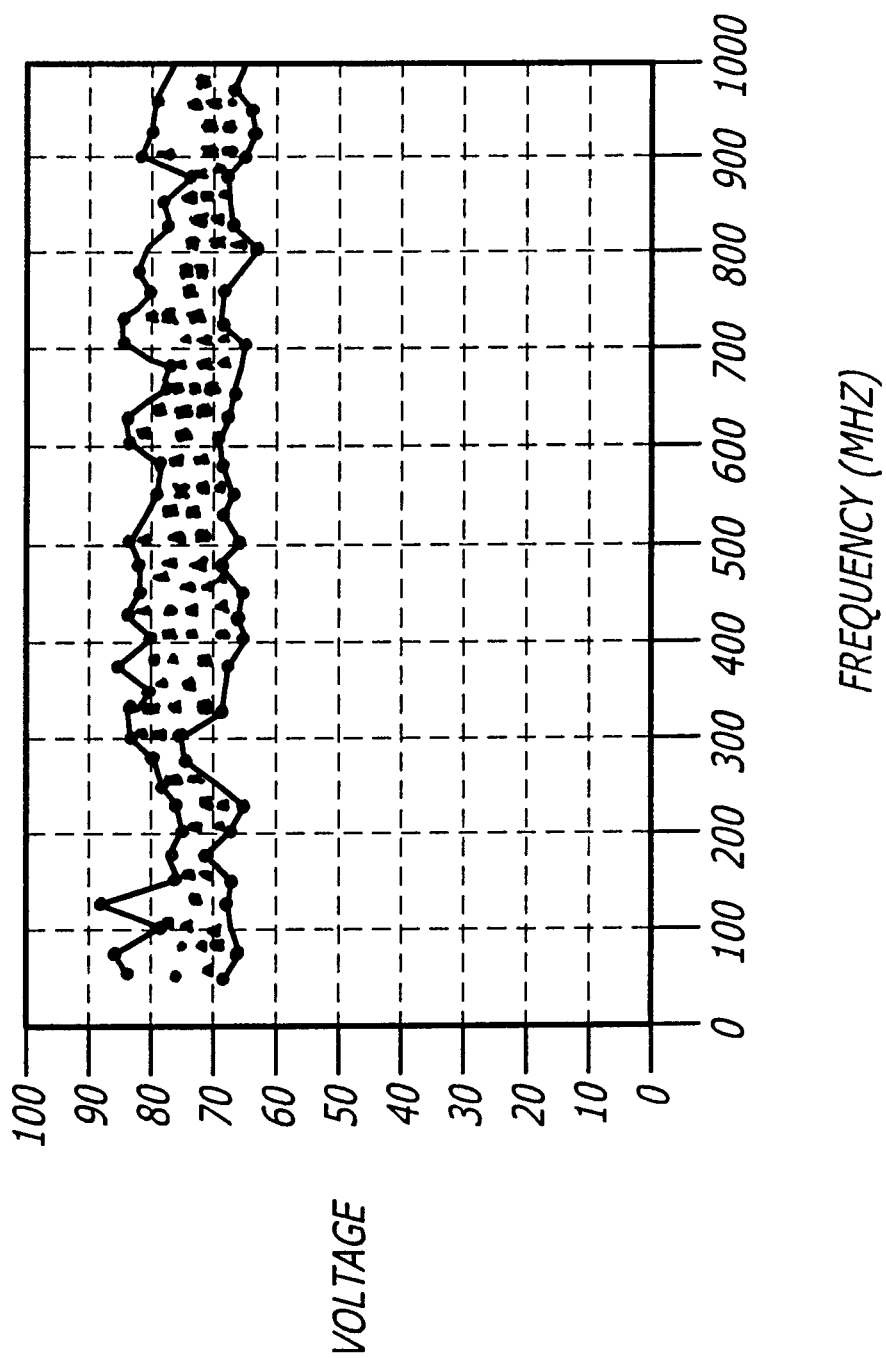

FIG. 6 shows a graph of empirically obtained limits for average CM voltage vs. frequency. The data are obtained by comparison of average CM voltages on differential pairs of eight 24-port Ethernet DUTs and their measured radiated emission on the OATS. The X-axis shows the frequency (MHz) and the Y-axis shows the CM voltage at the measurement port of the probe plus 25 dB which was the gain at the measurement amplifier used in the test setup. The average CM voltage vs. frequency was calculated from the sum and compared to the electric-field levels that were measured at the OATS. Finally, a CM voltage that would produce field levels at the EN55022 class A limit was linearly extrapolated. The average CM at each frequency was corrected by the measured margin to the EN55022 class A limit. In that way, the CM voltage equivalent of the EN55022 class A was obtained for each of the used DUTs (see FIG. 6). Each of the 8 devices under test produced a data set representing a correlation between the average CM voltage and the EN55022A limit. An envelope was superimposed on the graph showing the minimum and maximum values. The minimum values in FIG. 6 correspond to the minimum measured CM voltage that correlates to the limit-level of EN55022 class A. The values represent the limit for the worst-case CM voltage situation (lowest CM voltage that yielded radiated emission at the limit of EN55022 class A).

In predicting the emission levels that would otherwise be obtained from a DUT at an OATS, CM voltages of each differential pair are measured, and the average CM voltage per pair vs. frequency is calculated for a 24-port Ethernet DUT, consisting of 48 differential pairs. The average CM voltage is then compared with the limits from FIG. 6. From the predicted EMI values, the invention allows for a fast and convenient way of determining whether the DUT is likely to fail or to fulfill the EMI requirement. If the measured average CM voltage falls between minimum and maximum envelopes from FIG. 6, the DUT may either fail or pass. This is the area of uncertainty.

Referring again to FIG. 6, the line tracing the maximums may represent a case where the maximum value of EMI was not found during the radiated-field measurements. Because the maximization process at the OATS is tedious and time consuming, the data includes errors which may be due to unintentional differences in the test setups, i.e. different cable arrangement during the maximization process. There are also errors due to normal accuracy and repeatability levels associated with obtaining data from the OATS. As the test predicted the absolute worst-case for emissions, phase-sift between different ports was neglected. Neglecting this factor also injects additional error into the results.

Although the invention has been described in relation to purely resistive impedances, those skilled in the electrical arts will clearly understand that its principles are equally applicable to circuits comprising complex impedances with capacitive and inductive components. The disclosed CM voltage probe could in such cases include inductances and capacitors elements in order to achieve the desired objectives of the invention.

While the invention has been described with reference to specific embodiments thereof, it will be understood by those skilled in the art that other embodiments could be devised and various modifications and changes can be made thereto without departing from the spirit or scope of the invention as set forth in the appended claims. The specification and drawings are, accordingly, to be regarded in an illustrative rather than a restrictive sense. Therefore, the scope of the invention should be limited only by the appended claims.

What is claimed is:

1. A method for predicting the electromagnetic interference (EMI) radiated by unshielded differential-pair cables, the method comprising the steps of:
   connecting a voltage probe to the unshielded differential-pair cable from the DUT at a first interface and to a voltage measurement device at a second interface, the voltage probe providing differential impedance matching at the first interface, common mode impedance matching at the second interface, and differential voltage cancellation at the second interface;
   measuring the common mode voltage present at the second interface while the DUT is in operation; and,
   comparing the measured common mode voltage to a predetermined voltage value that corresponds to an EMI level.

2. The method of claim 1, further comprising:
   determining if the common mode voltage is above said limit for EMI and issuing a signal representative of said determination.

3. A common mode voltage probe, comprising:
   a first interface to connect to at least one unshielded differential-pair cable, having a first lead and a second lead, and connected to a device under test (DUT) at the other end, said DUT having differential outputs;
   a second interface to connect to a device that measures common mode voltage; and,
   a first circuit composed of a first resistive element (R1), a second resistive element (R2), a third resistive element (R3), and a fourth resistive element (R4), each resistive element having a first end and a second end, where R1 is connected between the first and second leads, the first end of R2 is connected to the first lead, the first end of R3 is connected to the second lead, the second ends of R2 and R3 are connected to the first end of R4, the interconnection between R2, R3, and R4 defining the second interface, the second end of R4 is connected to ground, the first circuit providing differential impedance matching at the first interface, common mode impedance matching at the second interface, and differential voltage cancellation at the second interface.

4. The voltage probe of claim 3 wherein said probe is adapted to make contact to a chassis ground of said DUT.

5. The voltage probe of claim 3 wherein said probe is shielded.

6. The voltage probe of claim 3 wherein said first interface has the same differential impedance to match the differential impedance of said DUT.

7. The first circuit of claim 3, wherein R1 equals 165Ω, R2 equals 130Ω, R3 equals 130Ω, and R4 equals 75Ω.

8. The first circuit of claim 3, wherein R1 equals 154.7Ω, R2 equals 141.4Ω, R3 equals 141.4Ω, and R4 equals 70.7 Ω.

9. The voltage probe of claim 3 wherein said first interface is adapted to couple to an output connector of said DUT.

10. The voltage probe of claim 9 wherein said first interface is adapted to couple to an RJ45 connector of a LAN equipment.

11. The first circuit of claim 3 further comprising a second circuit, having a first input, a second input, a first output, a second output, the first input connected to the first lead, the second input connected to the second lead of said at least one differential pair cable, the first and second outputs coupled to a differential output for connection to an auxiliary device, said second circuit permitting the measurement of common mode voltage of said DUT via said first circuit while said DUT is simultaneously connected to said auxiliary device allowing differential signals to be sent to and received from said auxiliary device.

12. The second circuit of claim 11 including:
   a fifth resistive element (R5), a sixth resistive element (R6), a seventh resistive element (R7), an eighth resistive element (R8), and a ninth resistive element (R9), each resistive element having a first end and a second end, the first end of R6 connected to the first input, the second end of R6 connected to the first end of R9, the second end of R9 connect to the first output, the first end of R5 connected to the second input, the second end of R5 connected to the first end of R8, the second end of R8 connected to the second output, and R7 connected between the second ends of R5 and R6.

13. A method for correlating electromagnetic interference (EMI) from an unshielded differential-pair cable to common mode voltages output by a device under test (DUT), the method comprising the steps of:
   connecting a voltage probe to the unshielded differential-pair cable from the DUT at a first interface and to a voltage measurement device at a second interface, the voltage probe providing differential impedance matching at the first interface, common mode impedance matching at the second interface, and differential voltage cancellation at the second interface;
   making a plurality of measurements, while the DUT is in operation, of common mode voltage at the second interface, the frequency of the DUT output signal, and the EMI radiated by the differential-pair cable, thereby providing a means to predict EMI from unshielded differential-pair cables by measuring the common mode voltage at the output of the DUT.

14. The method of claim 13, further comprising:
adapting said probe to make contact to a chassis ground of said DUT.

15. The method of claim 13, further comprising:
matching the output common mode impedance of said DUT to the impedance of a measuring device.

16. The method of claim 13, further comprising:
shielding said probe.

17. The method of claim 13 wherein the common mode voltage present at the second interface is provided by arranging a first resistive element (R1) between the terminals of said at least one differential pair cables at the first interface, connecting a second resistive element (R2) and a third resistive element (R3) in series with each of the differential pair cables, and further connecting a fourth resistive element (R4) between said second and said third resistive elements at one end and to the chassis ground of said DUT at the other end.

* * * * *